(12) United States Patent
Fujihara et al.

(10) Patent No.: US 9,450,166 B2
(45) Date of Patent: Sep. 20, 2016

(54) RESONATOR ELEMENT, RESONATOR, ELECTRONIC DEVICE, ELECTRONIC APPARATUS, MOBILE BODY AND METHOD OF MANUFACTURING RESONATOR ELEMENT

(71) Applicant: Seiko Epson Corporation, Tokyo (JP)

(72) Inventors: Yoshitaka Fujihara, Minowa (JP); Kazuhisa Hatanaka, Minowa (JP); Matsutaro Naito, Minowa (JP)

(73) Assignee: Seiko Epson Corporation (JP)

( * ) Notice: Subject to any disclaimer, the term of this patent is extended or adjusted under 35 U.S.C. 154(b) by 149 days.

(21) Appl. No.: 13/910,569

(22) Filed: Jun. 5, 2013

(65) Prior Publication Data

US 2013/0328452 A1    Dec. 12, 2013

(30) Foreign Application Priority Data

Jun. 6, 2012    (JP) .................... 2012-128662

(51) Int. Cl.
| | |
|---|---|
| H03H 9/05 | (2006.01) |
| H01L 41/047 | (2006.01) |
| H01L 41/29 | (2013.01) |
| H03H 3/02 | (2006.01) |
| H03H 9/02 | (2006.01) |
| H03H 9/10 | (2006.01) |
| H03H 9/13 | (2006.01) |

(52) U.S. Cl.
CPC ........... *H01L 41/0475* (2013.01); *H01L 41/29* (2013.01); *H03H 3/02* (2013.01); *H03H 9/02086* (2013.01); *H03H 9/0542* (2013.01); *H03H 9/0547* (2013.01); *H03H 9/0552* (2013.01); *H03H 9/1021* (2013.01); *H03H 9/131* (2013.01)

(58) Field of Classification Search
CPC . H01L 41/047; H01L 41/0475; H03H 9/131; H03H 9/0547
USPC ................ 310/344, 348, 364–366
See application file for complete search history.

(56) References Cited

U.S. PATENT DOCUMENTS

| | | | |
|---|---|---|---|
| 5,969,463 A | 10/1999 | Tomita et al. | |
| 2010/0066213 A1* | 3/2010 | Takahashi | ............... 310/364 |
| 2010/0096358 A1* | 4/2010 | Taniguchi et al. | ............. 216/20 |
| 2010/0096951 A1 | 4/2010 | Yamada | |
| 2010/0244630 A1 | 9/2010 | Wada | |
| 2011/0227457 A1* | 9/2011 | Ishikawa et al. | ............. 310/344 |

FOREIGN PATENT DOCUMENTS

| | | |
|---|---|---|
| JP | 57-028415 | 2/1982 |
| JP | 57-51331 | 3/1982 |

(Continued)

OTHER PUBLICATIONS

Machine translation of JP 10-308645 generated by the website of the European Patent Office.*

*Primary Examiner* — Derek Rosenau

(74) *Attorney, Agent, or Firm* — Harness, Dickey & Pierce, P.L.C.

(57) ABSTRACT

A resonator element includes: a substrate; and an electrode that includes a first conductive layer provided on a surface of the substrate, and a second conductive layer, provided on the opposite side to the first conductive layer on the substrate side, which is disposed within an outer edge of the first conductive layer when seen in a plan view from a direction perpendicular to the surface.

15 Claims, 15 Drawing Sheets

(56) References Cited

FOREIGN PATENT DOCUMENTS

| | | |
|---|---|---|
| JP | 02-260910 | 10/1990 |
| JP | 10-079640 | 3/1998 |
| JP | 10-284966 | 10/1998 |
| JP | 10-308645 | 11/1998 |
| JP | 11-145768 A | 5/1999 |
| JP | 2000-295067 A | 10/2000 |
| JP | 2001-024468 A | 1/2001 |
| JP | 2001-211052 A | 8/2001 |
| JP | 2001-251160 A | 9/2001 |
| JP | 2004-266703 A | 9/2004 |
| JP | 2006-129383 A | 5/2006 |
| JP | 2008-005333 A | 1/2008 |
| JP | 2008-085997 A | 4/2008 |
| JP | 2008-245243 A | 10/2008 |
| JP | 2008-263387 A | 10/2008 |
| JP | 2008-266748 A | 11/2008 |
| JP | 2009-055394 A | 3/2009 |
| JP | 2010-057087 A | 3/2010 |
| JP | 2010-062723 A | 3/2010 |
| JP | 2010-232806 A | 10/2010 |
| JP | 2011-019206 A | 1/2011 |

* cited by examiner

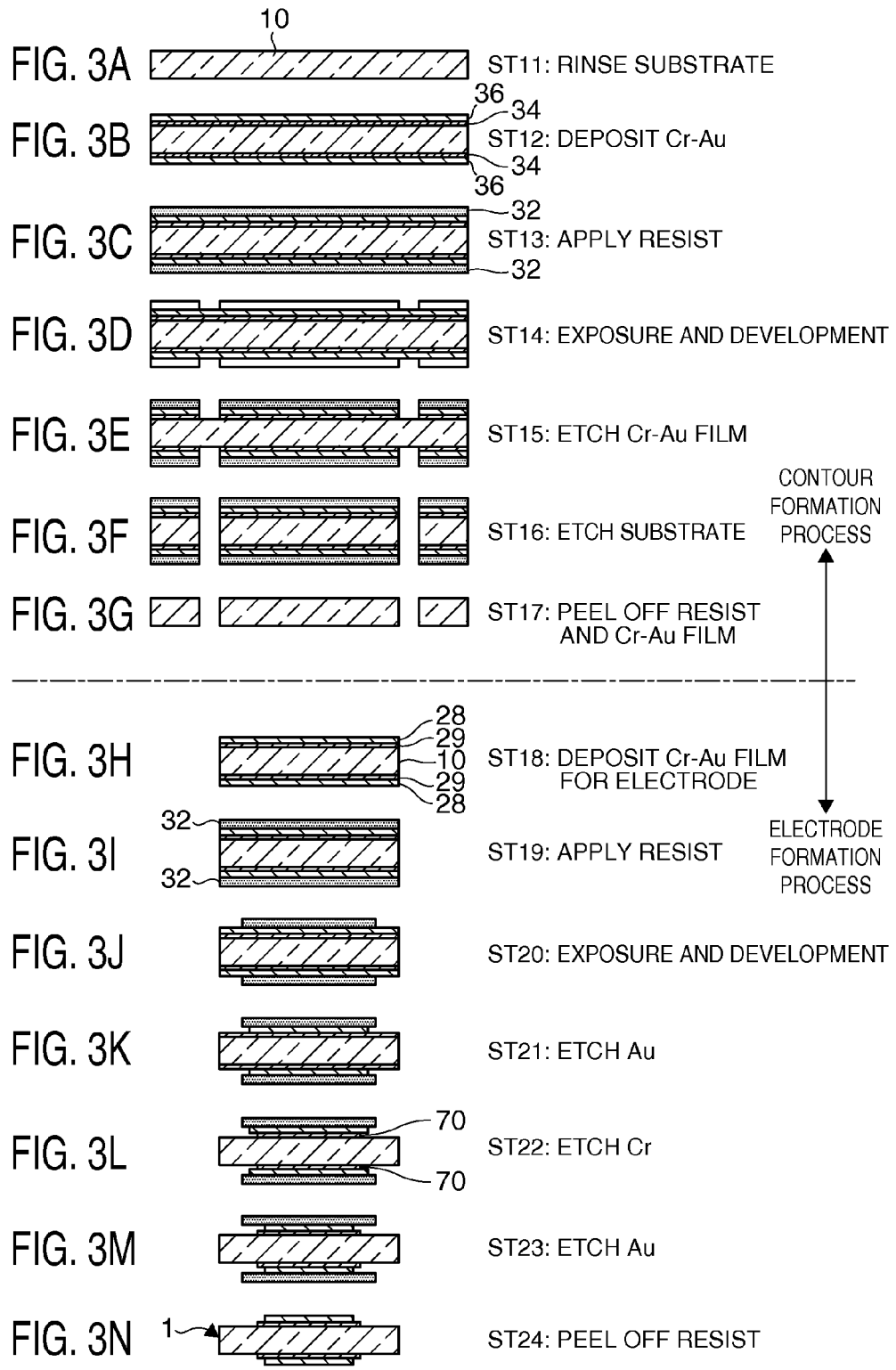

FIG. 3A ST11: RINSE SUBSTRATE
FIG. 3B ST12: DEPOSIT Cr-Au
FIG. 3C ST13: APPLY RESIST
FIG. 3D ST14: EXPOSURE AND DEVELOPMENT
FIG. 3E ST15: ETCH Cr-Au FILM
FIG. 3F ST16: ETCH SUBSTRATE
FIG. 3G ST17: PEEL OFF RESIST AND Cr-Au FILM

CONTOUR FORMATION PROCESS

FIG. 3H ST18: DEPOSIT Cr-Au FILM FOR ELECTRODE
FIG. 3I ST19: APPLY RESIST
FIG. 3J ST20: EXPOSURE AND DEVELOPMENT
FIG. 3K ST21: ETCH Au
FIG. 3L ST22: ETCH Cr
FIG. 3M ST23: ETCH Au
FIG. 3N ST24: PEEL OFF RESIST

ELECTRODE FORMATION PROCESS

RESONATOR ELEMENT, RESONATOR, ELECTRONIC DEVICE, ELECTRONIC APPARATUS, MOBILE BODY AND METHOD OF MANUFACTURING RESONATOR ELEMENT

BACKGROUND

1. Technical Field

The present invention relates to a resonator element that excites a thickness shear vibration, a resonator, an electronic device, an electronic apparatus, a mobile body and a method of manufacturing a resonator element.

2. Related Art

Since quartz crystal resonators using a quartz crystal resonator element in which a main vibration is excited by a thickness shear vibration are suitable for a decrease in size and a rise in frequency, and have excellent frequency-temperature characteristics, the quartz crystal resonators are used in many fields of oscillators, electronic apparatus and the like. Particularly, in recent years, with decreases in size and thickness of various electronic apparatus such as a cellular phone and a computer, there has also been a great need for further decreases in size and thickness of the quartz crystal resonators used in these electronic apparatus.

JP-A-2011-19206 discloses a method of manufacturing a plurality of quartz crystal resonator elements in a batch processing mode from a large-size quartz crystal substrate, using a photolithography technique and an etching technique at the time of the formation of a contour shape and an excitation electrode of the quartz crystal resonator element.

However, when a decrease in size of the quartz crystal resonator is attempted to achieve, there has been a problem in that vibration energy leaks due to the close distance between a vibration region and a holding portion to thereby reduce CI (quartz crystal impedance=equivalent resistance of quartz crystal resonator), an unnecessary spurious vibration such as a thickness bending vibration dependent on the profile dimensions of a vibration portion is generated in the vicinity of a resonance frequency of a thickness shear vibration which is a main vibration, and a discontinuous fluctuation in frequency and CI for a temperature change, that is, a so-called anomalous activity dip or the like occurs. Consequently, JP-A-2010-62723 proposes a method of avoid a reduction in CI or an anomalous activity dip with a decrease in size by forming a quartz crystal resonator element having a mesa structure, and discloses a method of manufacturing a plurality of quartz crystal resonator elements in a batch processing mode from a large-size quartz crystal substrate, using a photolithography technique and an etching technique at the time of the formation of a contour shape and an excitation electrode of the quartz crystal resonator element, in order to achieve mass production or a reduction in cost.

When the quartz crystal resonator element is manufactured by the manufacturing method disclosed in JP-A-2011-19206 or JP-A-2010-62723, the contour shape is uniform and the excitation electrode is disposed at a predetermined position with a high degree of accuracy, thereby allowing a quartz crystal resonator element that sufficiently satisfies a specification standard such as CI and temperature characteristics to be obtained. However, there has been a problem in that the Drive Level Dependence (DLD) characteristics of the quartz crystal resonator element influencing the start-up of an oscillator in which the quartz crystal resonator element is mounted are deteriorated considerably, and the manufacturing yield rate is lowered remarkably.

SUMMARY

An advantage of some aspects of the invention is that in a method of manufacturing a plurality of resonator elements from a large-size substrate using a photolithography technique and an etching technique, a small-size resonator element and a method of manufacturing a resonator element capable of improving the yield rate of a DLD characteristic inspection are provided.

The invention can be implemented as the following forms or application examples.

APPLICATION EXAMPLE 1

This application example is directed to a resonator element including: a substrate; and an electrode that includes a first conductive layer provided on a surface of the substrate, and a second conductive layer, provided on the opposite side to the first conductive layer on the substrate side, which is disposed within an outer edge of the first conductive layer when seen in a plan view from a direction perpendicular to the surface.

According to this application example, in the resonator element excited by a thickness shear vibration, since a void portion, causing the deterioration of DLD characteristics, which is not tightly attached between the first conductive layer and the second conductive layer of the electrode is not present, there is an effect of obtaining the resonator element capable of preventing the deterioration of the DLD characteristics and improving the yield rate of a DLD characteristics inspection.

APPLICATION EXAMPLE 2

The resonator element according to the application example may be configured such that, when seen in a plan view from the direction perpendicular to the surface of the substrate, a region surrounded by an outer edge of the second conductive layer is smaller than a region surrounded by the outer edge of the first conductive layer.

According to this application example, since both the first conductive layer and the second conductive layer of the electrode are tightly attached, there is an effect of obtaining the resonator element capable of preventing the deterioration of the DLD characteristics and improving the yield rate of a DLD characteristics inspection.

APPLICATION EXAMPLE 3

The resonator element according to the application example may be configured such that the electrode includes an excitation electrode.

According to this application example, since the electrode to which both the first conductive layers and the second conductive layers are tightly attached is used as the excitation electrode, there is an effect of obtaining the resonator element capable of preventing the deterioration of the DLD characteristics and having stable resonance characteristics.

APPLICATION EXAMPLE 4

The resonator element according to the application example may be configured such that the substrate is a substrate that vibrates through a thickness shear vibration.

According to this application example, since the thickness shear vibration is suitable for a decrease in size and a rise in frequency, and frequency-temperature characteristics having an excellent cubic curve are obtained, there is an effect of obtaining the small-size resonator element having excellent frequency-temperature characteristics at a high frequency.

APPLICATION EXAMPLE 5

The resonator element according to the application example may be configured such that the resonator element further includes a vibration portion that vibrates through a thickness shear vibration and an outer edge portion, formed integrally with an outer edge of the vibration portion, which has a smaller thickness than that of the vibration portion.

According to this application example, since the vibration portion has a mesa structure, a combination with a profile spurious vibration is avoided. Since vibrational energy of only a main vibration can be trapped, there is an effect of obtaining the resonator element in which the CI is small, and a spurious vibration in the vicinity of a resonance frequency is suppressed.

APPLICATION EXAMPLE 6

The resonator element according to the application example may be configured such that the resonator element further includes a vibration portion that vibrates through a thickness shear vibration and an outer edge portion, formed integrally with an outer edge of the vibration portion, which has a larger thickness than that of the vibration portion.

According to this application example, even in a case of the high-frequency resonator element having a very thin vibration portion, amount can be performed in the thick outer edge portion formed integrally with the vibration portion, there is an effect of obtaining the resonator element having excellent impact resistance or vibration resistance and high reliability.

APPLICATION EXAMPLE 7

This application example is directed to a resonator including the resonator element according to the application example described above; and a package in which the resonator element is received.

According to this application example, since the influence of a disturbance such as a temperature change or a humidity change or the influence due to a contamination can be prevented by receiving the resonator element in the package, there is an effect of obtaining the small-size resonator having excellent frequency reproducibility, frequency-temperature characteristic, CI temperature characteristics and frequency aging characteristics, and satisfactory DLD characteristics.

APPLICATION EXAMPLE 8

This application example is directed to an electronic device including the resonator element according to the application example described above; an electronic element; and a container in which the resonator element and the electronic element are mounted.

According to this application example, the resonator element having satisfactory DLD characteristics is mounted in an oscillation circuit formed using various types of electronic elements, and thus there is an effect of obtaining the electronic device such as an oscillator having excellent start-up characteristics.

APPLICATION EXAMPLE 9

The electronic device according to the application example may be configured such that the electronic element is at least any of a thermistor, a capacitor, a reactance element, and a semiconductor element.

According to this application example, the resonator element having excellent frequency-temperature characteristics and satisfactory DLD characteristics is mounted in an oscillation circuit including a temperature compensation circuit or a voltage control circuit formed using various types of electronic element, there is an effect of obtaining the electronic device such as a small-size temperature compensation type oscillator or a voltage control type oscillator having excellent start-up characteristics.

APPLICATION EXAMPLE 10

This application example is directed to an electronic apparatus including the resonator element according to the application example described above.

According to this application example, since the resonator element having satisfactory DLD characteristics can be directly mounted in a mounting substrate using a chip on board (COB) technique, there is an effect capable of forming the small-size electronic apparatus including a satisfactory reference frequency source having a small mounting area and excellent oscillation start-up characteristics.

APPLICATION EXAMPLE 11

This application example is directed to an electronic apparatus including the resonator according to the application example described above.

According to this application example, there is an effect capable of forming the electronic apparatus including a satisfactory reference frequency source in which the specification standard such as CI and temperature characteristics is sufficiently satisfied, the resonator having the resonator element with satisfactory DLD characteristics is used, and oscillation start-up characteristics are excellent.

APPLICATION EXAMPLE 12

This application example is directed to an electronic apparatus including the electronic device according to the application example described above.

According to this application example, there is an effect capable of forming the electronic apparatus including a satisfactory reference frequency source in which the specification standard such as CI and temperature characteristics is sufficiently satisfied and the electronic device having the resonator element with satisfactory DLD characteristics is used in the electronic apparatus, and thus oscillation start-up characteristics are excellent.

APPLICATION EXAMPLE 13

This application example is directed to a mobile body including the resonator element according to the application example described above.

According to this application example, there is an effect capable of forming the mobile body including a stable and correct electronic control unit which is capable of forming a stable reference frequency source by using the resonator element having satisfactory frequency-temperature characteristics.

APPLICATION EXAMPLE 14

This application example is directed to a method of manufacturing a resonator element, including: preparing a substrate in which two or more conductive layers having different materials are stacked; etching an upper conductive layer within the stacked conductive layers; etching a lower conductive layer provided closer to the substrate side than the upper conductive layer; and etching the etched upper conductive layer using an etching solution having a higher etching rate of the upper conductive layer than that of the lower conductive layer.

According to this application example, since the under-etching portion of the upper conductive layer occurring at the time of etching the lower conductive layer of the excitation electrode can be removed by etching the lateral side of the upper conductive layer again, there is an effect capable of increasing adhesion between the upper conductive layer and the lower conductive layer, and manufacturing the resonator element having satisfactory DLD characteristics.

APPLICATION EXAMPLE 15

The method of manufacturing a resonator element according to the application example may be configured such that the etching rate of the lower conductive layer is lower than the etching rate of the upper conductive layer with respect to the etching solution used for etching the upper conductive layer, and the etching rate of the upper conductive layer is lower than the etching rate of the lower conductive layer with respect to the etching solution used for etching the lower conductive layer.

According to this application example, since the upper conductive layer and the lower conductive layer can be selectively etched, there is an effect capable of forming the excitation electrode having a high accuracy of the contour dimensions of each conductive layer, and manufacturing the small-size resonator element having small variation of various characteristics and satisfactory DLD characteristics.

APPLICATION EXAMPLE 16

The method of manufacturing a resonator element according to the application example may be configured such that materials of the upper conductive layer and the lower conductive layer are different from each other.

According to this application example, since an etching solution corresponding to each conductive layer can be used due to the different materials of the upper conductive layer and the lower conductive layer, there is an effect capable of forming the excitation electrode having a high accuracy of the contour dimensions by selectively etching each conductive layer, and manufacturing the small-size resonator element having small variations of various characteristics and satisfactory DLD characteristics.

APPLICATION EXAMPLE 17

The method of manufacturing a resonator element according to the application example may be configured such the material of the upper conductive layer is any of Au, Ag, and Pt, and the material of the lower conductive layer is any of Cr, Ni, Ti, and NiCr alloy.

According to this application example, since the materials of the upper conductive layer and the lower conductive layer can be combined so as to have frequency-temperature characteristics or CI suitable for the purpose of use, there is an effect capable of manufacturing the small-size resonator element having excellent frequency-temperature characteristics and small CI.

BRIEF DESCRIPTION OF THE DRAWINGS

The invention will be described with reference to the accompanying drawings, wherein like numbers reference like elements.

FIG. 1A is a plan view, and FIG. 1B is a cross-sectional view taken along line P-P.

FIGS. 3A to 3N are schematic cross-sectional views of a flow chart illustrating an example of a method of manufacturing the resonator element according to an embodiment of the invention.

FIG. 4A is a cross-sectional view illustrating the resonator element manufactured by the manufacturing method according to the embodiment, and FIG. 4B is a cross-sectional view illustrating a resonator element manufactured by a manufacturing method in the related art.

FIG. 5A is a diagram illustrating frequency change amounts, and FIG. 5B is a diagram illustrating CI change amounts.

FIG. 6A is a diagram illustrating frequency change amounts, and FIG. 6B is a diagram illustrating CI change amounts.

FIG. 7A is a plan view, and FIG. 7B is a cross-sectional view taken along line P-P.

FIG. 8A is a plan view of a first modification example 101, and FIG. 8B is a plan view of a second modification example 102, and FIG. 8C is a plan view of a third modification example 103.

FIG. 9A is a plan view, and FIG. 9B is a cross-sectional view taken along line P-P.

FIG. 10A is a plan view, and FIG. 10B is a longitudinal cross-sectional view.

FIG. 11A is a plan view, and FIG. 11B is a longitudinal cross-sectional view.

FIG. 12A is a longitudinal cross-sectional view of the first modification example, and FIG. 12B is a longitudinal cross-sectional view of the second modification example.

DESCRIPTION OF EXEMPLARY EMBODIMENTS

Figure 1A:
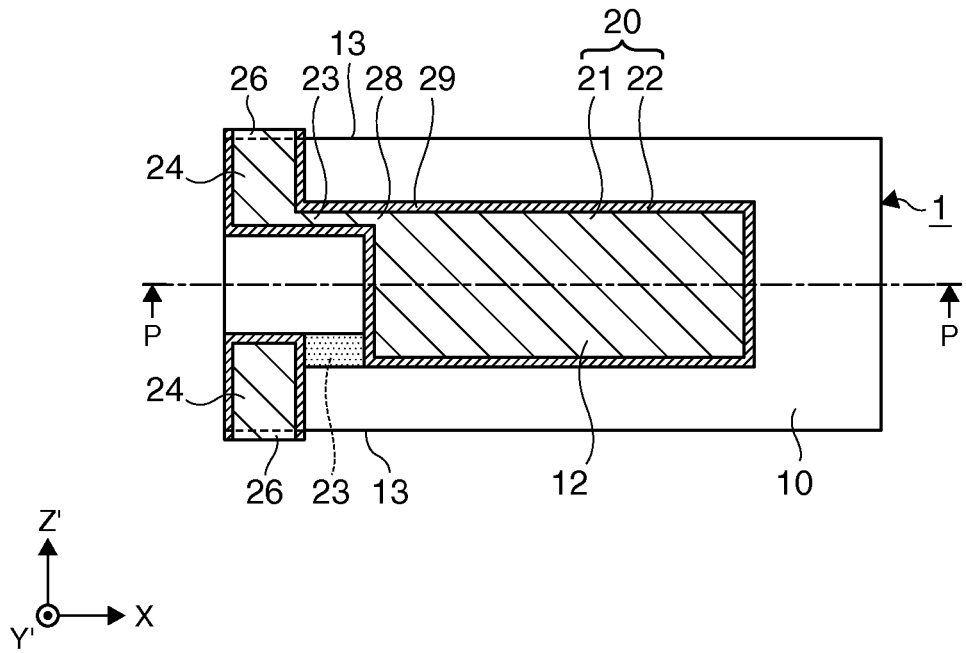
FIGS. 1A and 1B are schematic diagrams illustrating a structure of a resonator element according to an embodiment of the invention.
Figure 1B:
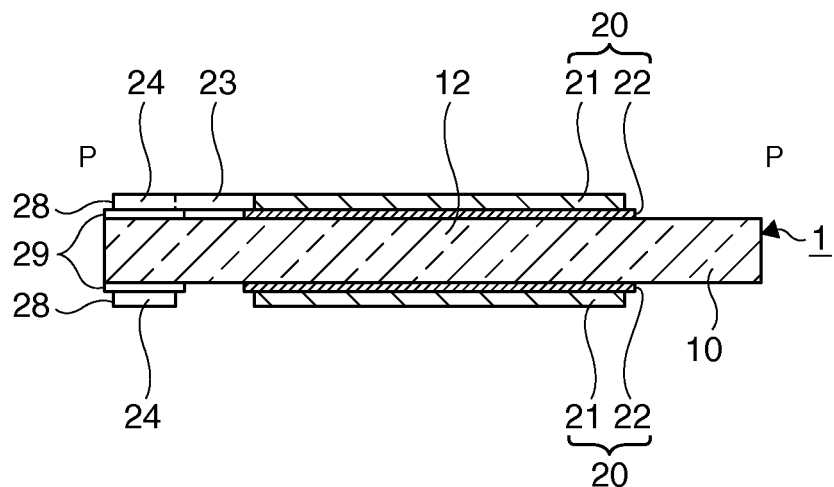

Hereinafter, an embodiment of the invention will be described in detail with reference to the accompanying drawings. FIGS. 1A and 1B are schematic diagrams illustrating a configuration of a resonator element according to an embodiment of the invention. FIG. 1A is a plan view of the resonator element, and FIG. 1B is a cross-sectional view taken along line P-P of FIG. 1A.

Configuration of Resonator Element

A resonator element 1 includes a substrate 10 having a vibration portion 12, and underlying electrode layers 29 as lower conductive layers (first conductive layers) and electrode layers 28 as uppermost conductive layers (second conductive layers), which are stacked on both main surfaces (front and rear surfaces in a ±Y' direction) of the substrate 10 so as to face each other. Meanwhile, in the embodiment, a configuration in which two conductive layers are stacked will be described below.

The resonator element 1 includes excitation electrodes 20 including the underlying electrode layer 29 and the electrode layer 28, lead electrodes 23, pad electrodes 24, and connection electrodes 26.

The excitation electrodes 20 are electrodes that drive the vibration portion 12, and are formed on the substantially central portions of both main surfaces (front and rear surfaces in a ±Y' direction) of the vibration portion 12 so as to face each other. The excitation electrode 20 includes a main electrode 21 which is a portion of the electrode layer 28 and a main electrode underlying portion 22 which is a portion of the underlying electrode layer 29, and is formed so that the outer edge of the main electrode 21 is received within the outer edge of the main electrode underlying portion 22.

The lead electrode 23 is electrically conductively connected to the pad electrode 24, protruding from the excitation electrode 20, which is formed at the end of the substrate 10.

The pad electrodes 24 are formed at the ends of both main surfaces of the substrate 10 so as to face each other. The pad electrodes 24 on the both main surfaces are electrically conductively connected to each other through the connection electrodes 26 formed at lateral side portions 13 of the substrate 10.

In the embodiment shown in FIG. 1A, an example is shown in which the shapes of the excitation electrodes 20 formed on the main surfaces of the substantially central portion of the vibration portion 12 so as to face each other are rectangular, but the shapes of the excitation electrodes may be circular or elliptical without the need to be limited thereto.

In addition, the excitation electrode 20, the lead electrode 23, the pad electrode 24 and the connection electrode 26 are configured such that, for example, chromium (Cr) is deposited on a lower layer and gold (Au) is superposedly deposited on an uppermost layer, using a vapor deposition apparatus, a sputtering system or the like. Meanwhile, as electrode materials, nickel (Ni), titanium (Ti), or nickel-chromium alloy (NiCr) may be used for the lower layer instead of chromium (Cr), and silver (Ag) or platinum (Pt) may be used for the uppermost layer instead of gold (Au).

Further, a configuration in which two conductive layers are stacked will be described below, but is not limited thereto. A configuration in which three or more layers are stacked may be used.

Figure 2:
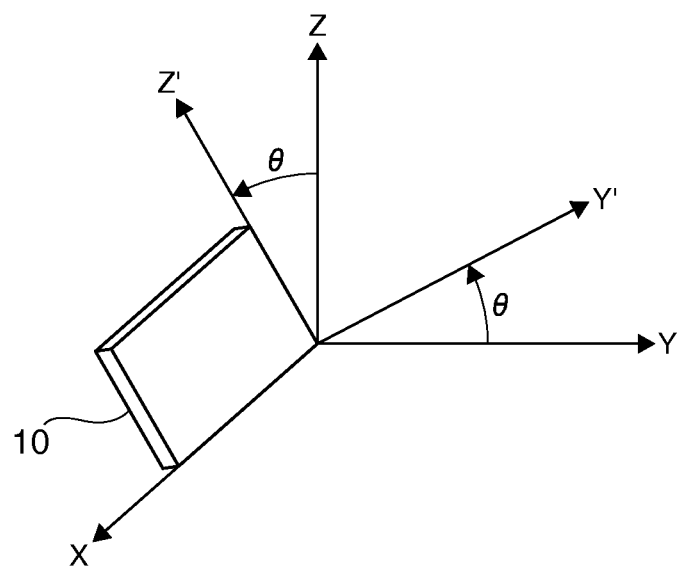
FIG. 2 is a diagram illustrating a relationship between an AT-cut quartz crystal substrate and a crystal axis.

When the substrate 10 is formed of a piezoelectric material, the resonator element 1 is configured such that an electric field occurs in the vibration portion 12 located between the excitation electrodes 20 due to an excitation current which is input from the pad electrode 24, and that the vibration portion 12 vibrates due to a piezoelectric effect. When the substrate 10 is formed using quartz crystal belonging to a trigonal piezoelectric material, the substrate 10 has crystal axes X, Y, and Z which are at right angles to each other as shown in FIG. 2. The X-axis is referred to as an electrical axis, the Y-axis is referred to as a mechanical axis, and the Z-axis is referred to as an optic axis. A flat plate, formed of a so-called rotated Y-cut quartz crystal substrate, which is cut off along a flat surface having an XZ plane rotated by a predetermined angle θ around the X-axis is used as the substrate 10.

For example, when the rotated Y-cut quartz crystal substrate is an AT-cut quartz crystal substrate, the angle θ is 35.25° (35°15'). Here, when the Y-axis and the Z-axis are rotated by the angle θ around the X-axis, and are set to a Y'-axis and a Z'-axis, the AT-cut quartz crystal substrate has crystal axes X, Y', and Z' which are at right angles to each other. Therefore, in the AT-cut quartz crystal substrate, the thickness direction thereof is the Y'-axis, the surface including the X-axis and the Z'-axis which are perpendicular to the Y'-axis is a main surface, and a thickness shear vibration is excited as a main vibration on the main surface. The substrate 10 is formed of the AT-cut quartz crystal substrate formed in this manner. Meanwhile, the substrate 10 according to the embodiment is not limited to an AT-cut substrate having the angle θ of 35.25° shown in FIG. 2, but may be, for example, the substrate 10 such as a BT-cut substrate that excites the thickness shear vibration.

Method of Manufacturing Resonator Element

Next, a method of manufacturing the resonator element according to an embodiment of the invention will be described with reference to a flow chart of FIGS. 3A to 3N. In the resonator element 1, in consideration of mass productivity and manufacturing costs, a plurality of resonator elements 1 are generally manufactured from a large-size substrate using a batch processing mode. Herein, a schematic cross-sectional view of one resonator element 1 will be described. Manufacturing processes are constituted by a contour formation process of forming a contour shape of the resonator element 1, and an electrode formation process of forming electrode patterns on both main surfaces of the substrate 10 of the resonator element 1.

In the contour formation process, first, the substrate 10 is rinsed by pure water (ST11), and subsequently, an underlying film 34 is provided on each of the front and rear surfaces of the substrate 10. This film is provided in order to make up for weak adhesion of gold (Au) serving as a corrosion-resistant film 36 to the substrate 10, and chromium (Cr) is deposited as the underlying film 34, for example, by sputtering, vapor deposition or the like. Gold (Au) is deposited thereon as the corrosion-resistant film 36 by sputtering, vapor deposition or the like (ST12).

Next, a resist 32 is applied to the whole surface of the corrosion-resistant film 36 (ST13), and a resonator element contour mask is formed by exposing and developing the resist (ST14).

Subsequently, gold (Au) which is the corrosion-resistant film 36 exposed from a mask opening is etched using, for example, a potassium iodide solution, and next, chromium (Cr) which is the underlying film 34 is etched using a ceric-2 ammonium nitrate solution (ST15).

Here, using a potassium iodide solution which is an etching solution of gold (Au) serving as the corrosion-resistant film 36, gold (Au) is selectively etched, and chromium (Cr) which is the underlying film 34 is not etched. Alternatively, even when the chromium is etched, the etching rate thereof is equal to or less than 1/10 of gold (Au).

In addition, using a ceric-2 ammonium nitrate solution which is an etching solution of chromium (Cr) serving as the underlying film 34, chromium (Cr) is also selectively etched, and gold (Au) which is the corrosion-resistant film 36 is not etched. Alternatively, even when the gold is etched, the etching rate thereof is equal to or less than 1/10 of chromium (Cr).

Therefore, since the upper corrosion-resistant film 36 and the lower underlying film 34 can be selectively etched, it is possible to form a contour mask with a high dimensional accuracy, and to obtain the resonator element 1 with high-accuracy contour dimensions.

Next, when the substrate 10 exposed from the mask opening is, for example, a quartz crystal substrate, the substrate is etched using an ammonium fluoride solution or the like (ST16). Thereby, as shown in FIG. 1A, the contour of the resonator element 1 is formed.

Subsequently, the resist 32 is peeled off, and the corrosion-resistant film 36 and the underlying film 34 are all removed using the two kinds of solutions (ST17).

Next, an electrode formation process will be described. With respect to an electrode formation, similarly to the contour formation, gold (Au) which is the electrode layer 28 as an uppermost conductive layer and chromium (Cr), for increasing the adhesion of the substrate 10, which is the underlying electrode layer 29 as a lower conductive layer are deposited on each of the front and rear surfaces of the substrate 10 in the order of chromium (Cr) and gold (Au) by sputtering, vapor deposition or the like (ST18).

Next, the resist 32 is applied to the whole surface of the electrode layer 28 (ST19), and an excitation electrode mask is formed by exposing and developing the resist (ST20).

Subsequently, gold (Au) and chromium (Cr) for the excitation electrode 20 are also etched using the solution used in the contour formation process. First, gold (Au) serving as the electrode layer 28 is etched (ST21), and thereafter, chromium (Cr) of the underlying electrode layer 29 is etched (ST22). At this time, a void portion 70 occurs between the electrode layer 28 and the substrate 10, and thus gold (Au) serving as the electrode layer 28 is next etched again in order to remove the void portion 70 (ST23).

Here, since an etching solution capable of selectively etching the electrode layer 28 and the underlying electrode layer 29 is used, the excitation electrode 20 with high-accuracy contour dimensions can be obtained similarly to the process in which the resonator element with high-accuracy contour dimensions is obtained.

Thereafter, the resist 32 is peeled off (ST24), and the resonator element 1 is completed.

In a manufacturing method in the related art, after chromium (Cr) of the underlying electrode layer 29 is etched, the resist 32 has been peeled off (equivalent to ST24), and the resonator element 1 has been completed. For this reason, the resonator element 1 having the void portion 70 between the electrode layer 28 and the substrate 10 has been obtained.

In the manufacturing method of the above-mentioned embodiment, after chromium (Cr) of the underlying electrode layer 29 is etched (ST22), gold (Au) serving as the electrode layer 28 is etched again (ST23).

Thereby, after chromium (Cr) of the underlying electrode layer 29 is etched, the void portion 70 occurring between the electrode layer 28 and the substrate 10 can be eliminated. The elimination of the void portion 70 will be described next.

Figure 4A:
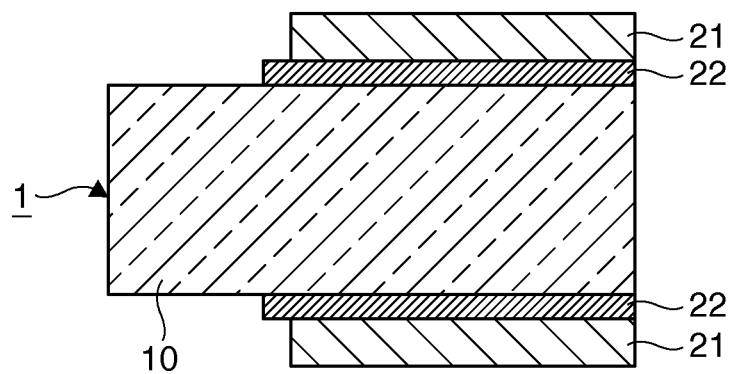
FIGS. 4A and 4B are enlarged cross-sectional views illustrating a configuration of an electrode of the resonator element according to an embodiment of the invention.
Figure 4B:
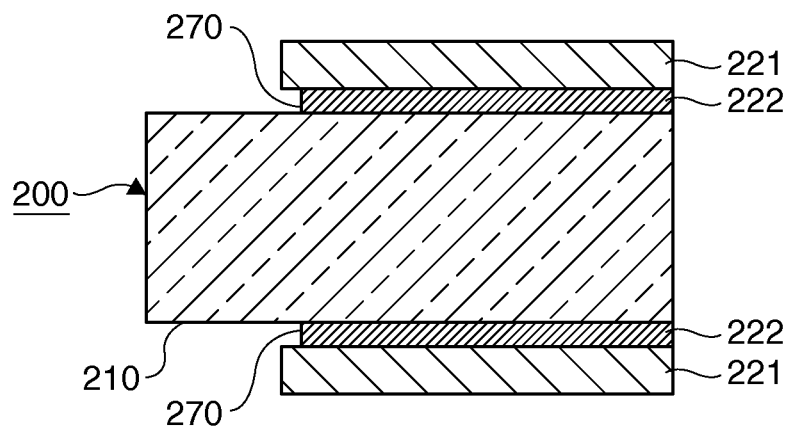

FIGS. 4A and 4B are enlarged cross-sectional views illustrating a configuration of an electrode of the resonator element according to the embodiment of the invention. FIG. 4A is a cross-sectional view of the resonator element manufactured by a manufacturing method of the embodiment, and FIG. 4B is a cross-sectional view of the resonator element manufactured by a manufacturing method in the related art.

In a resonator element 200 manufactured by the manufacturing method in the related art shown in FIG. 4B, a void portion 270 is present between a main electrode 221 and a substrate 210. On the other hand, in the resonator element 1 in the manufacturing method according to the embodiment of FIG. 4A, the void portion 70 shown in FIG. 31 (ST22) does not occur. The cause for the occurrence of the void portion 270 between the main electrode 221 and the substrate 210 in the manufacturing method in the related art is because a deposited metal material is isotropic, and the progress of etching not only in a direction perpendicular to the substrate surface during etching, but also in a direction parallel to the substrate gives rise to side etching which is a phenomenon in which etching progresses even on the sidewall surface of a main electrode underlying portion 222 or an undercut which is a corrosion phenomenon in which an etching solution flows below a mask. Therefore, at the time of the etching of chromium (Cr), the contour shape (outer edge) of the main electrode underlying portion 222 which is a portion of the underlying electrode layer 29 becomes smaller than that of the main electrode 221 serving as a mask, and thus the void portion 270 occurs. It has been turned out by researches, experiments, and analyses of the inventors that the void portion 270 deteriorates DLD characteristics considerably, and lowers manufacturing yield rates remarkably.

For this reason, in the manufacturing method according to the embodiment, after the etching of chromium (Cr) of the main electrode underlying portion 22 (ST22 shown in FIG. 31), a process of re-etching (ST23 shown in FIG. 3M) gold (Au) which is the main electrode 21 of a region protruding further outside than the contour of the main electrode underlying portion 22 due to the void portion 70 is added. Gold (Au) of at least the protruding region is removed by this re-etching (ST23), and thus the void portion 70 is eliminated. Thereby, the outer edge of the main electrode 21 is received further inside than the outer edge of the main electrode underlying portion 22, and thus the formation of the excitation electrode 20 in which the main electrode 21 is tightly attached to the main electrode underlying portion 22 has been realized in the whole region of an interface between the main electrode 21 and the main electrode underlying portion 22.

Meanwhile, here, the excitation electrode 20 shown in FIGS. 1A and 1B has been described by way of example, but it is preferable to form a similar electrode configuration in other electrodes (lead electrode 23, pad electrode 24, and connection electrode 26).

Figure 5A:
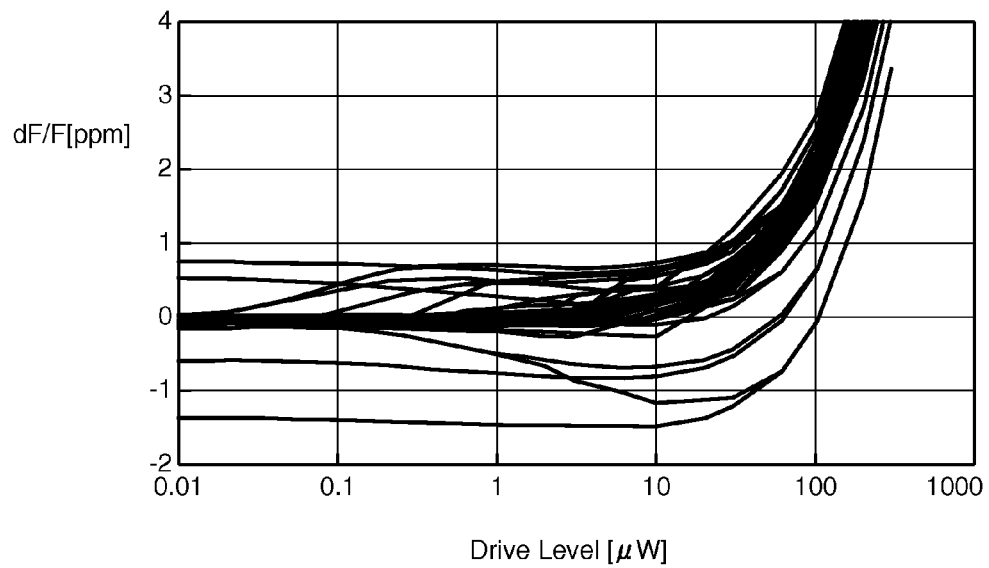
FIGS. 5A and 5B are diagrams illustrating DLD characteristics of the resonator element manufactured by the manufacturing method according to an embodiment of the invention.
Figure 5B:
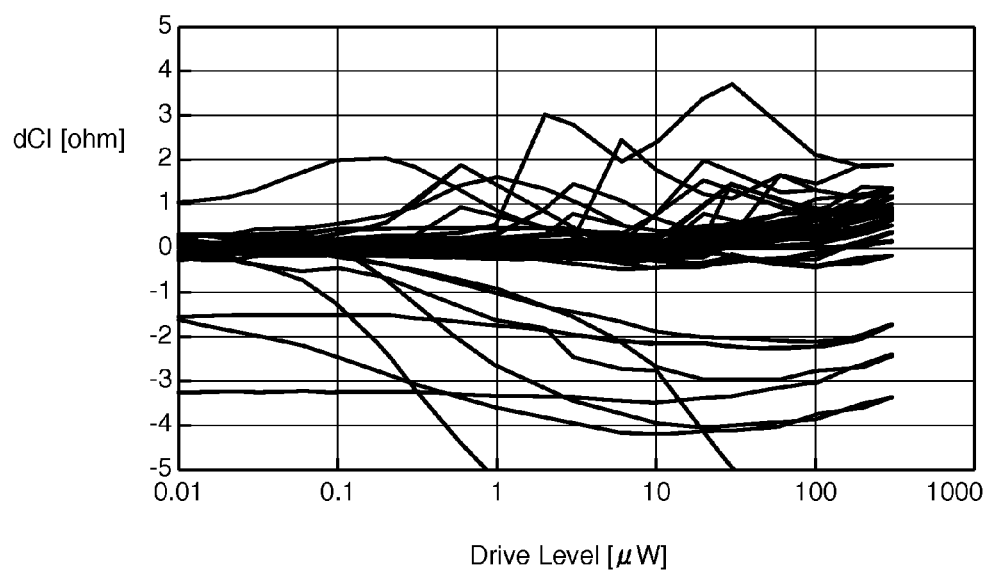

FIGS. 5A and 5B are diagrams illustrating the DLD characteristics of the resonator element manufactured by the manufacturing method according to the embodiment of the invention. FIG. 5A is a diagram illustrating frequency change amounts, and FIG. 5B is a diagram illustrating CI change amounts.

Figure 6A:
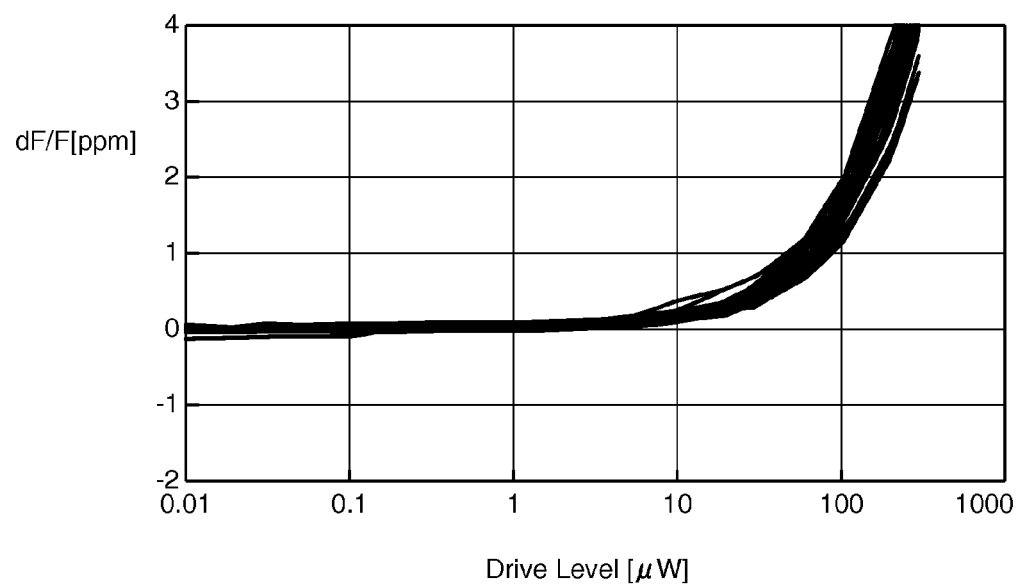
FIGS. 6A and 6B are diagrams illustrating the DLD characteristics of the resonator element manufactured by the manufacturing method in the related art.
Figure 6B:
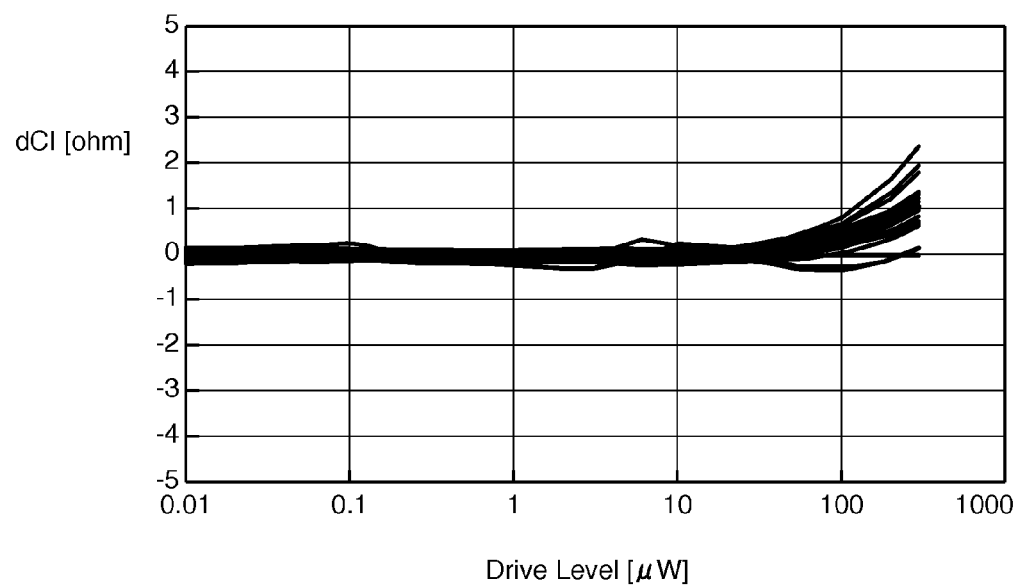

In addition, FIGS. 6A and 6B are diagrams illustrating the DLD characteristics of the resonator element manufactured by the manufacturing method in the related art. FIG. 6A is a diagram illustrating frequency change amounts, and FIG. 6B is a diagram illustrating CI change amounts.

From FIGS. 5A and 5B and FIGS. 6A and 6B, the DLD characteristics of the resonator element 1 in the manufacturing method according to the embodiment have smaller variations and are more stable than those in the manufacturing method in the related art with respect to both the frequency and the CI.

So far, the deterioration of the DLD characteristics has been said to be caused by the generation of residual stress, contamination or the like occurring in the substrate at the time of the processing of the resonator element 1. Regarding the residual stress, the influence thereof is considered to be extremely small because contour processing using a photolithography technique is performed. Regarding the contamination, the influence thereof is also considered to be small because a process of removing a metal film piece or a substrate piece by overdrive (strong excitation drive) is performed at the time of an operation or an assembly within a clean room.

However, it has been turned out by researches of the inventors that the cause for a great variation in the DLD characteristics of the resonator element 200 manufactured by the manufacturing method in the related art is due to a large influence of the void portion 270 occurring between the main electrode 221 and the substrate 210. In other words, a portion of the main electrode 221 of around the void portion 270 in which the main electrode underlying portion 222 is removed is in a state similar to a state as if foreign matters such as a metal piece and metal powder are attached thereto, and vibrational energy leaks at the time of excitation, and thus a change in frequency or a change in CI is considered to be caused.

Therefore, in the manufacturing method according to the embodiment in which a process of re-etching (ST23) gold (Au) serving as the main electrode 21 after chromium (Cr) of the main electrode underlying portion 22 is etched (ST22) is added, since the main electrode 21 which is not tightly attached to the main electrode underlying portion 22 expected to deteriorate the DLD characteristics is not provided, a very great effect is exerted which capable of improving the yield rate of a DLD characteristic inspection of the resonator element 1 and manufacturing a resonator element having very excellent DLD characteristics.

Figure 7A:
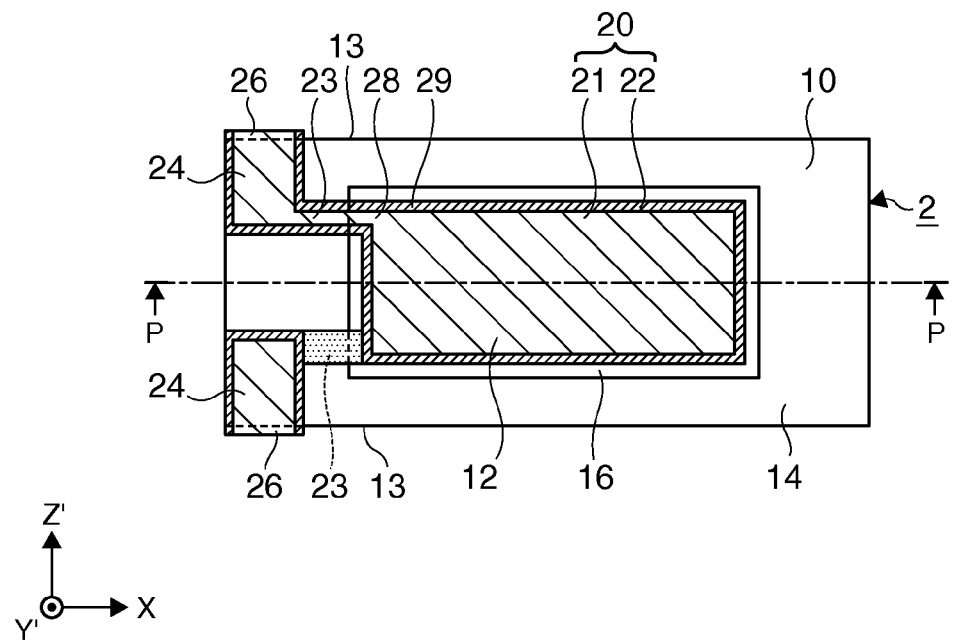
FIGS. 7A and 7B are schematic diagrams illustrating a structure of the resonator element according to an embodiment of the invention.
Figure 7B:
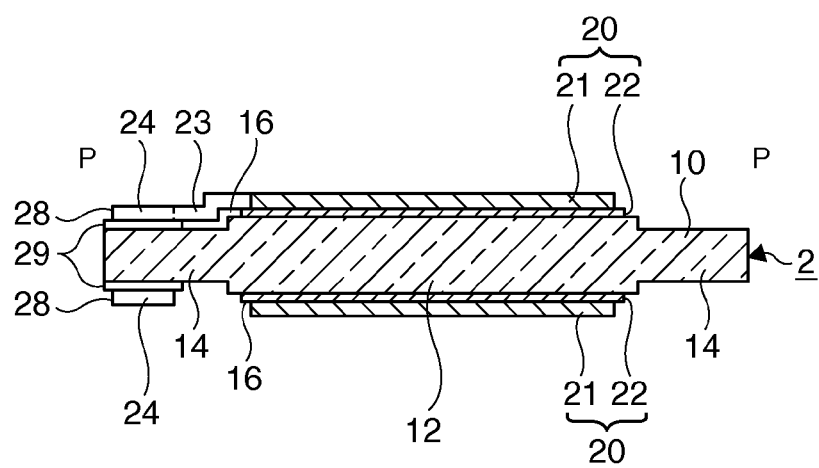

FIGS. 7A and 7B are schematic diagrams illustrating a configuration of a resonator element according to an embodiment of the invention. FIG. 7A is a plan view of the resonator element, and FIG. 7B is a cross-sectional view taken along line P-P of FIG. 7A.

A resonator element 2 includes a substrate 10 having a vibration portion 12, and underlying electrode layers 29 as lower conductive layers and electrode layers 28 as uppermost conductive layers, which are stacked on both main surfaces (front and rear surfaces in a ±Y' direction) of the substrate 10 so as to face each other.

The resonator element 2 includes the substrate 10, excitation electrodes 20 including the underlying electrode layer 29 and the electrode layer 28, lead electrodes 23, pad electrodes 24, and connection electrodes 26.

The substrate 10 includes the vibration portion 12, and a thin portion 14 having a plate thickness smaller than that of the vibration portion 12.

The excitation electrodes 20 are electrodes that drive the vibration portion 12, and are formed on the substantially central portions of both main surfaces (front and rear surfaces in a ±Y' direction) of the vibration portion 12 so as to face each other. The excitation electrode 20 includes a main electrode 21 which is a portion of the electrode layer 28 and a main electrode underlying portion 22 which is a portion of the underlying electrode layer 29, and is formed so that the outer edge of the main electrode 21 is received within the outer edge of the main electrode underlying portion 22.

The lead electrode 23 is electrically conductively connected to the pad electrode 24, protruding from the excitation electrode 20, which is formed at the end of the substrate 10.

The pad electrodes 24 are formed at the ends of both main surfaces of the thin portion 14 of the substrate 10 so as to face each other. The pad electrodes 24 on the both main surfaces are electrically conductively connected to each other through the connection electrodes 26 formed at lateral side portions 13 of the substrate 10.

In the embodiment shown in FIG. 7A, an example is shown in which the shapes of the excitation electrodes 20 formed on the main surfaces of the substantially central portion of the vibration portion 12 so as to face each other are rectangular, but the shapes of the excitation electrodes 20 may be circular or elliptical without the need to be limited thereto.

In addition, an example is shown in which mesa portions 16 have one-step difference on both front and rear main surfaces of the substrate 10, but the mesa portions may have multiple steps of mesa shape on the both front and rear main surfaces of the substrate 10 or may have one to multiple steps of mesa shape on either of the front and rear main surfaces of the substrate 10, without the need to be limited thereto. Further, an example is shown in which the shape of the mesa portion 16 is rectangular, but the shape of the mesa portion 16 may also be circular or elliptical, without the need to be limited thereto.

As shown in FIGS. 7A and 7B, when the substrate 10 having a mesa structure with the mesa portion 16 in the vibration portion 12 is formed, it is possible to avoid a combination with a profile spurious vibration, and to trap vibrational energy of only a main vibration. Therefore, there is an effect in which the CI is small, and the small-size resonator element 2 having a spurious vibration in the vicinity of a resonance frequency being suppressed is obtained.

Figure 8A:
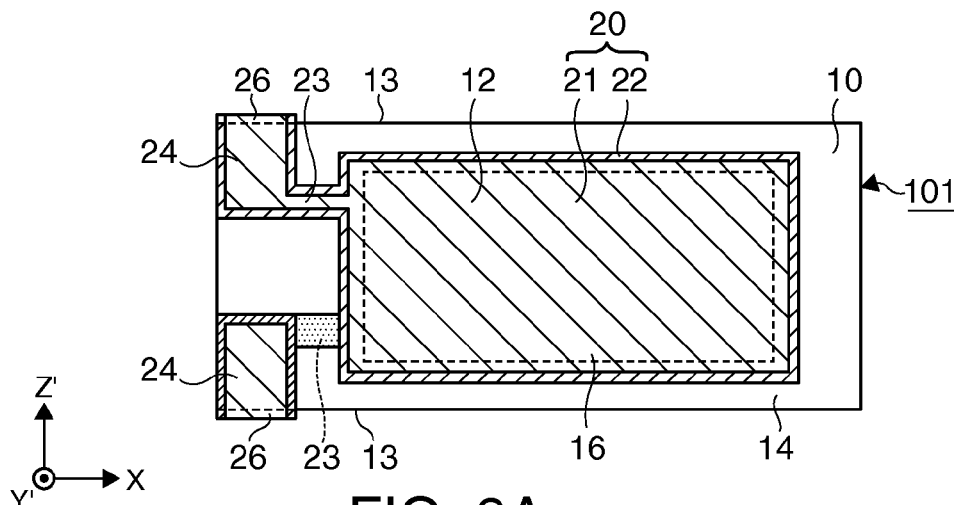
FIGS. 8A to 8C are schematic diagrams illustrating another structure of the resonator element according to an embodiment of the invention.
Figure 8B:
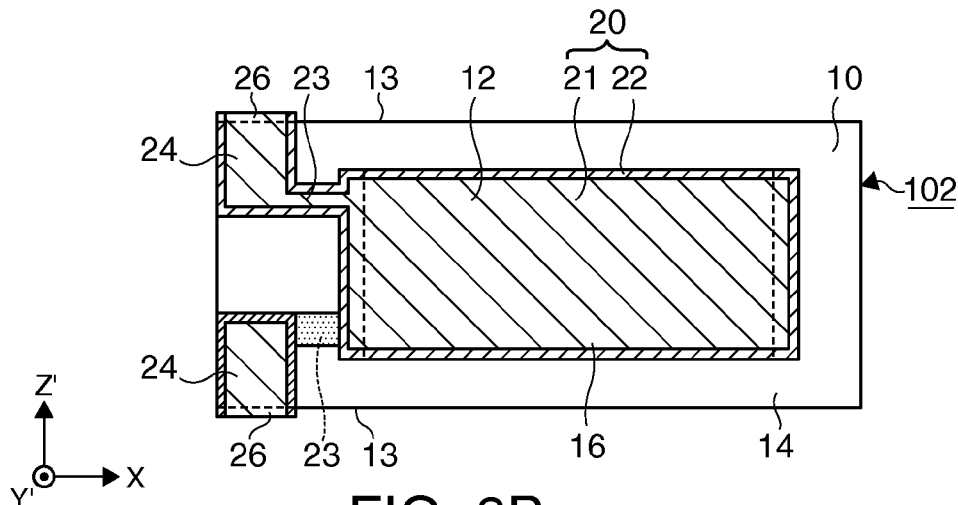
Figure 8C:
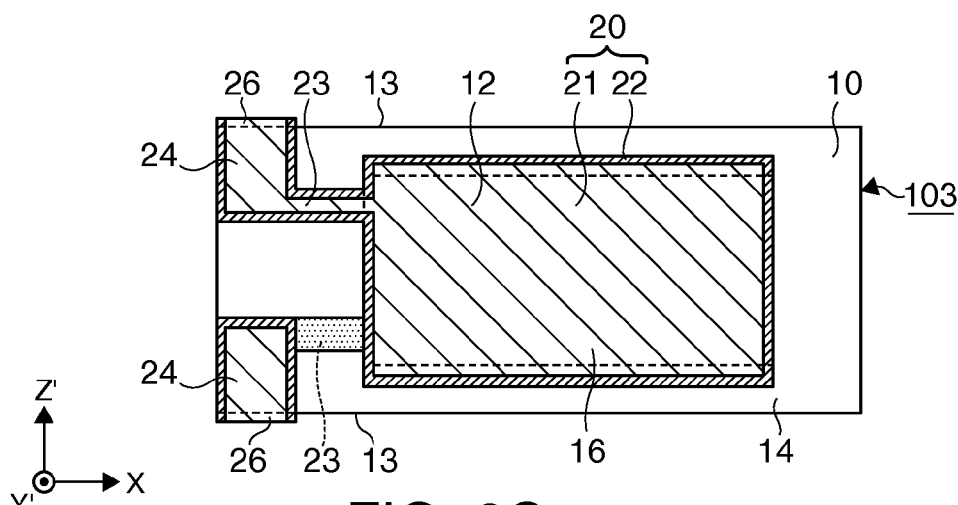

FIGS. 8A to 8C are schematic diagrams illustrating another structure of the resonator element according to the embodiment of the invention. FIG. 8A is a plan view of a first modification example, FIG. 8B is a plan view of a second modification example, and FIG. 8C is a plan view of a third modification example.

FIG. 8A is a diagram illustrating the first modification example 101 of the embodiment shown in FIGS. 7A and 7B, and shows a case where an excitation electrode 20 and a mesa portion 16 are formed on each of both front and rear main surfaces of the substrate 10, and the lengths of the excitation electrode 20 in an X-axis direction and a Z'-axis direction are all larger than those of the mesa portion 16 in the same directions. FIG. 8B is a diagram illustrating the second modification example 102, and shows a case where the lengths of the excitation electrode 20 and the mesa portion 16 in the Z'-axis direction are the substantially same as each other, and the length of the excitation electrode 20 in the X-axis direction is larger than that of mesa portion. FIG. 8C is a diagram illustrating the third modification example 103, and shows a case where the lengths of the excitation electrode 20 and the mesa portion 16 in the X-axis direction are the substantially same as each other, and the length of the excitation electrode 20 in the Z'-axis direction is larger than that of mesa portion.

Since the area of the excitation electrode 20 shown in FIGS. 8A to 8C can be made to be larger than that in FIGS. 7A and 7B, it is possible to reduce a capacitance ratio of a resonator. For this reason, when the resonator is used in an oscillator, there is an effect capable of increasing a frequency adjustment amount or a frequency variable amount.

Figure 9A:
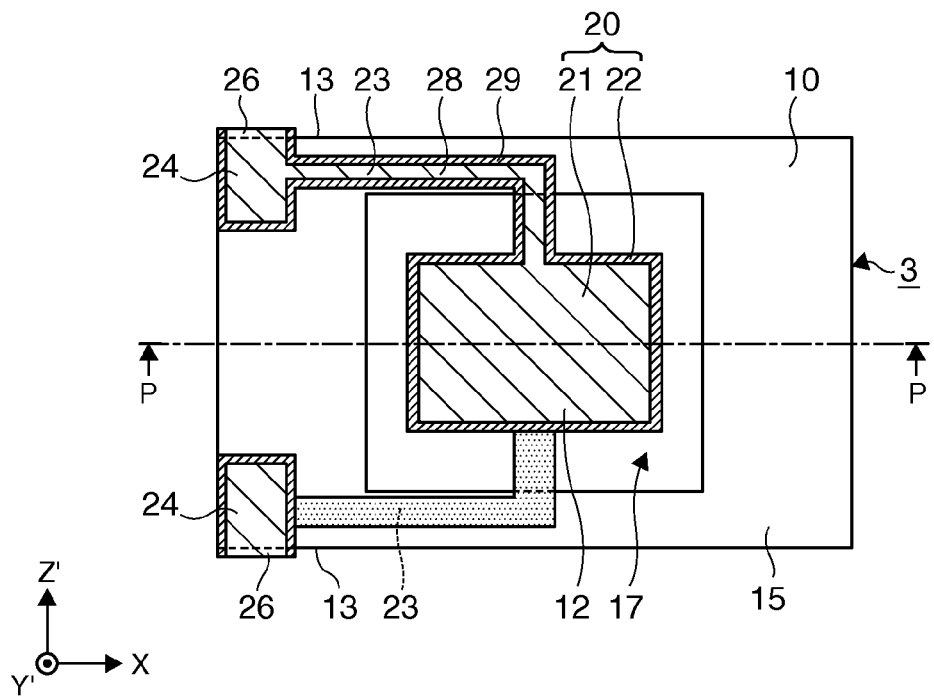
FIGS. 9A and 9B are schematic diagrams illustrating a structure of a fourth modification example of the resonator element according to an embodiment of the invention.
Figure 9B:
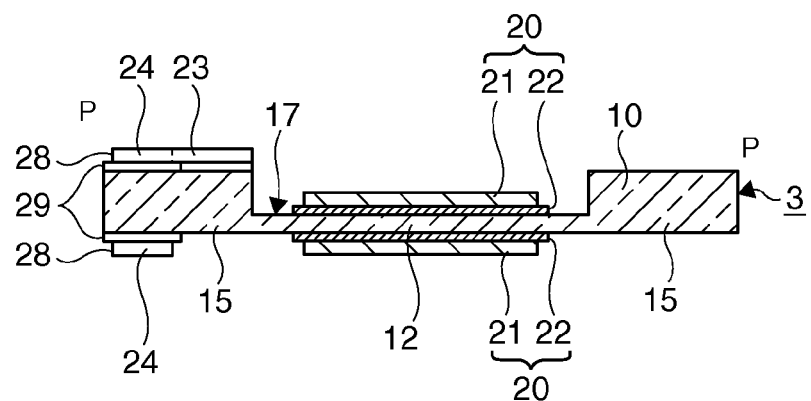

FIGS. 9A and 9B are schematic diagrams illustrating a structure of a fourth modification example of the resonator element according to the embodiment of the invention. FIG. 9A is a plan view of the resonator element, and FIG. 9B is a cross-sectional view taken along line P-P of FIG. 9A.

A resonator element 3 includes a substrate 10 having a vibration portion 12, and underlying electrode layers 29 as lower conductive layers and electrode layers 28 as uppermost conductive layers, which are stacked on both main surfaces (front and rear surfaces in a ±Y' direction) of the substrate 10 so as to face each other.

The resonator element 3 includes the substrate 10, excitation electrodes 20 including the underlying electrode layer 29 and the electrode layer 28, lead electrodes 23, pad electrodes 24, and connection electrodes 26.

The substrate 10 includes the resonator portion 12, and a thick portion 15 having a plate thickness larger than that of the vibration portion 12.

The excitation electrodes 20 are electrodes that drive the vibration portion 12, and are formed on the substantially central portions of both main surfaces (front and rear surfaces in a ±Y' direction) of the vibration portion 12 so as to face each other. The excitation electrode 20 includes a main electrode 21 which is a portion of the electrode layer 28 and a main electrode underlying portion 22 which is a portion of the underlying electrode layer 29, and is formed so that the outer edge of the main electrode 21 is received within the outer edge of the main electrode underlying portion 22.

The lead electrode 23 is electrically conductively connected to the pad electrode 24, protruding from the excitation electrode 20, which is formed at the end of the substrate 10.

The pad electrodes 24 are formed at the ends of both main surfaces of the thick portion 15 of the substrate 10 so as to face each other. The pad electrodes 24 on the both main surfaces are electrically conductively connected to each other through the connection electrodes 26 formed at lateral side portions 13 of the substrate 10.

In the embodiment shown in FIG. 9A, an example is shown in which the shapes and the areas of the excitation electrodes 20 formed on the main surfaces on the substantially central portion of the vibration portion 12 so as to face each other are the same as each other and are rectangular, but the shapes and the areas of the excitation electrodes 20 on the upper and lower portions are different from each other and the shapes thereof may also be circular or elliptical, without the need to be limited thereto.

In addition, a recessed portion 17 formed on the substantially central portion of the substrate 10 is formed by etching from one side of the substrate 10, but the recessed portions 17 facing each other may be formed by performing etching from both sides of the substrate 10.

As shown in FIGS. 9A and 9B, since the thickness of the vibration portion 12 can be reduced considerably by forming the substrate 10 having a reverse mesa structure using the recessed portion 17 as the vibration portion 12, it is possible to increase a resonance frequency, and to mount the substrate in the thick portion 15 formed integrally with the vibration portion 12. Therefore, there is an effect of obtaining the high-frequency resonator element 3 with high reliability having excellent impact resistance and vibration resistance.

Figure 10A:
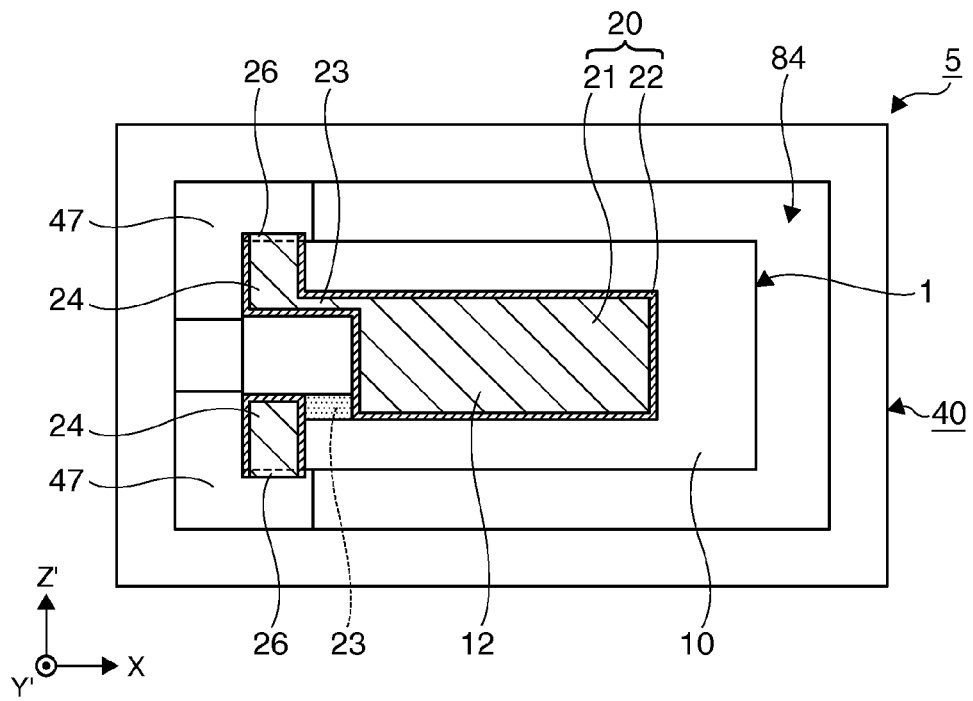
FIGS. 10A and 10B are schematic diagrams illustrating a structure of a resonator according to an embodiment of the invention.
Figure 10B:
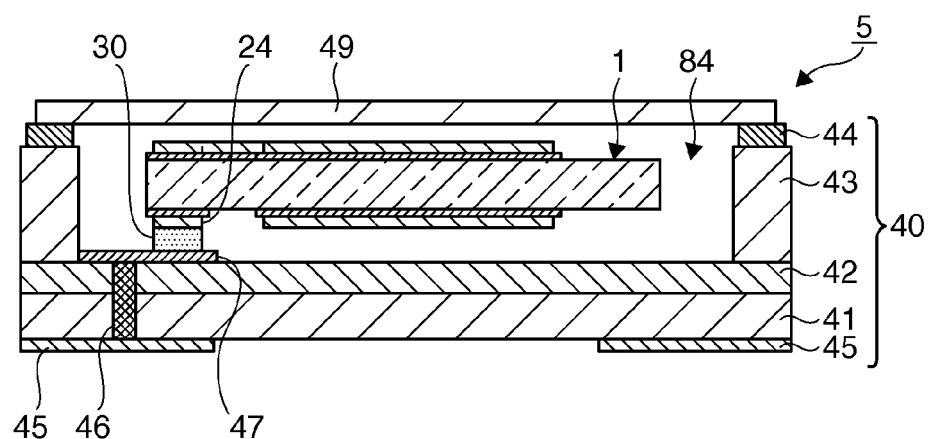

FIGS. 10A and 10B are schematic diagrams illustrating a configuration of a resonator according to an embodiment of the invention. FIG. 10A is a plan view in which a cover member is omitted, and FIG. 10B is a longitudinal cross-sectional view. A resonator 5 is constituted by a resonator element 1, a package body 40 formed in a rectangular box shape in order to receive the resonator element 1, a cover member 49 made of a metal, ceramic, glass, etc., and the like.

As shown in FIGS. 10A and 10B, the package body 40 is formed by stacking a first substrate 41, a second substrate 42, a third substrate 43, a seal ring 44, and mounting terminals 45. A plurality of mounting terminals 45 are formed on the external bottom of the first substrate 41. The third substrate 43 is an annular body of which the central portion is removed, and the seal ring 44 such as, for example, Kovar is formed on the upper edge of the third substrate 43.

A cavity 84 that receives the resonator element 1 is formed by the third substrate 43 and the second substrate 42. A plurality of element mounting pads 47 that allow electrical conduction to the mounting terminal 45 through a conductor 46 are provided at predetermined positions on the upper surface of the second substrate 42. The element mounting pad 47 is disposed so as to correspond to the pad electrode 24 formed at the end of the substrate 10 when the resonator element 1 is placed.

When the resonator element 1 is supported and fixed, the pad electrode 24 of the resonator element 1 is first placed on the element mounting pad 47 to which a conductive adhesive 30 is applied and a load is applied thereto.

Next, in order to harden the conductive adhesive 30, the conductive adhesive is put in a high-temperature furnace having a predetermined temperature for a predetermined time. After the conductive adhesive 30 is hardened, annealing is performed, and a frequency adjustment is performed by adding mass to the excitation electrode 20 or reducing the mass. Thereafter, the cover member 49 is placed on the seal ring 44 formed on the upper surface of the third substrate 43 of the package body 40, seam welding and sealing are performed on the cover member 49 in a vacuum or in an atmosphere of nitrogen gas, and thus the resonator 5 is completed.

Alternatively, there is also a method of placing the cover member 49 on low melting point glass applied onto the upper surface of the package body 40, and performing melting and tight attachment. Even in this case, the inside of the cavity of the package is vacuumized or inert gas such as nitrogen gas is filled therein, and thus the resonator 5 is completed.

In the above-mentioned embodiment of the resonator 5, an example has been described in which a laminated plate is used in the package body 40, but a single-layer ceramic plate may be used in the package body 40, and the resonator 5 may be formed using a cap obtained by performing a drawing process on the cover.

Figure 11A:
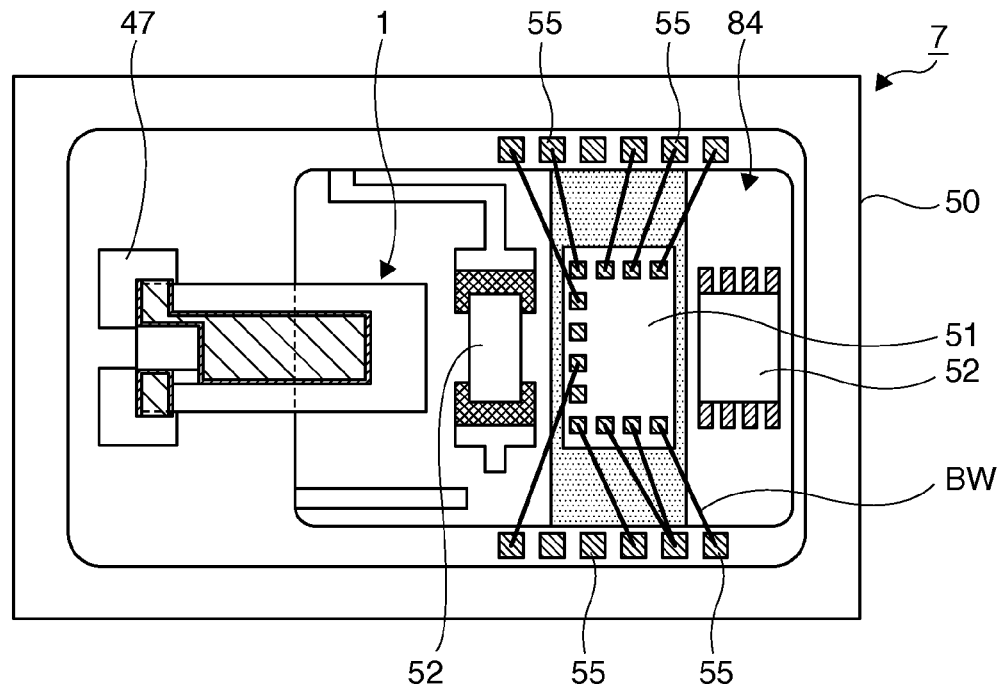
FIGS. 11A and 11B are schematic diagrams illustrating a structure of an electronic device according to an embodiment of the invention.
Figure 11B:
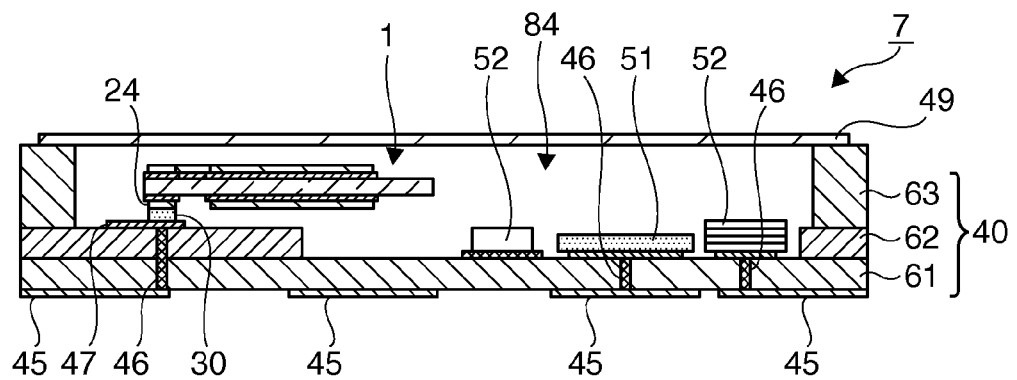

FIGS. 11A and 11B are schematic diagrams illustrating a configuration of an electronic device according to an embodiment of the invention. FIG. 11A is a plan view in which the cover member is omitted. FIG. 11B is a longitudinal cross-sectional view.

An electronic device 7 includes a package body 50, a cover member 49, a resonator element 1, an IC component 51 in which a oscillation circuit that excites the resonator element 1 is mounted, and at least one of a variable capacitive element of which the capacitance changes depending on a voltage, a thermistor of which the resistance changes depending on a temperature, and an electronic part 52 such as an inductor.

As shown in FIGS. 11A and 11B, the package body 50 is formed by stacking a first substrate 61, a second substrate 62, and a third substrate 63. A plurality of mounting terminals 45 are formed at the external bottom of the first substrate 61. The second substrate 62 and the third substrate 63 are formed of an annular body of which the central portion is removed.

The cavity 84 that receives the resonator element 1, the IC component 51, the electronic part 52 and the like is formed by the first substrate 61, the second substrate 62, and the third substrate 63. A plurality of element mounting pads 47 that allow electrical conduction to the mounting terminal 45 by the conductor 46 are provided at predetermined positions on the upper surface of the second substrate 62. The element mounting pad 47 is disposed so as to correspond to the pad electrode 24 formed at the end of the substrate 10 when the resonator element 1 is placed.

The pad electrode 24 of the resonator element 1 is placed on the element mounting pad 47 of the package body 50 to which the conductive adhesive 30 is applied, the conductive adhesive 30 is hardened at a predetermined temperature, and thus electrical conduction between the pad electrode 24 and the element mounting pad 47 is achieved. The IC component 51 is fixed to a predetermined position of the package body 50, and a terminal of the IC component 51 and an electrode terminal 55 of the package body 50 are connected to each other through a bonding wire BW. In addition, the electronic part 52 is placed at a predetermined position of the package body 50, and is connected to the conductor 46 using a metal bump or the like. The package body 50 is filled with a vacuum or inert gas such as nitrogen, and the package body 50 is sealed by the cover member 49, to thereby complete the electronic device 7.

As shown in FIGS. 11A and 11B, since the resonator element 1 having satisfactory DLD characteristics is used, the small-size electronic device 7 having excellent start-up characteristics is obtained.

In addition, using the electronic device 7, a small-size oscillator, a temperature compensation type oscillator, a voltage control type oscillator, and the like can be formed.

Next, another electronic device according to the embodiment will be described with reference to the accompanying drawings.

Figure 12A:
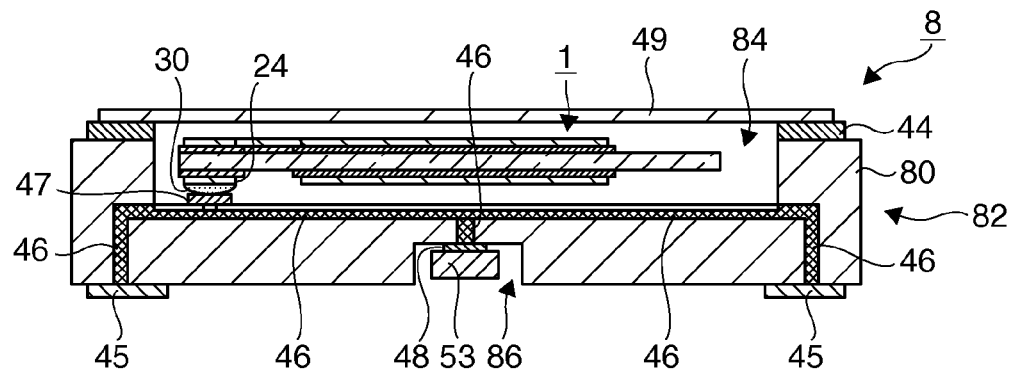
FIGS. 12A and 12B are schematic diagrams illustrating a structure of a modification example of the electronic device according to an embodiment of the invention.

FIG. 12A is a cross-sectional view illustrating an electronic device 8 according to a modification example of FIGS. 11A and 11B. The electronic device 8 generally includes a resonator element 1 of the invention, a thermistor 53 which is a thermo-sensitive device, and a package 82 that receives the resonator element 1 and the thermistor 53. The package 82 includes a package body 80 and a cover member 49. The package body 80 is configured such that a cavity 84 that receives the resonator element 1 is formed at the upper surface side, and that a concave portion 86 that receives the thermistor 53 is formed at the lower surface side. A plurality of element mounting pads 47 are provided at the end of the inner bottom of the cavity 84, and each of the element mounting pads 47 is electrically conductively connected to a plurality of mounting terminals 45 through the conductor 46. The conductive adhesive 30 is applied to the element mounting pad 47, the resonator element 1 is placed on the conductive adhesive 30, and the pad electrode 24 and each element mounting pad 47 are electrically connected and fixed to each other through the conductive adhesive 30. The seal ring 44 is burned on the upper portion of the package body 80, the cover member 49 is placed on the seal ring 44 and is welded using a resistance welder, and the cavity 84 is hermetically sealed. The inside of the cavity 84 may be vacuumized, and inert gas may be sealed therein.

On the other hand, the concave portion 86 is formed in the substantially central portion on the lower surface side of the package body 80, and an electronic component mounting pad 48 is burned on the upper surface of the concave portion 86. The thermistor 53 is mounted onto the electronic component mounting pad 48, and the electronic device 8 is formed by electrically conductive connection using a solder or the like. Meanwhile, the electronic component mounting pad 48 is electrically conductively connected to a plurality of mounting terminals 45 through the conductor 46.

Figure 12B:
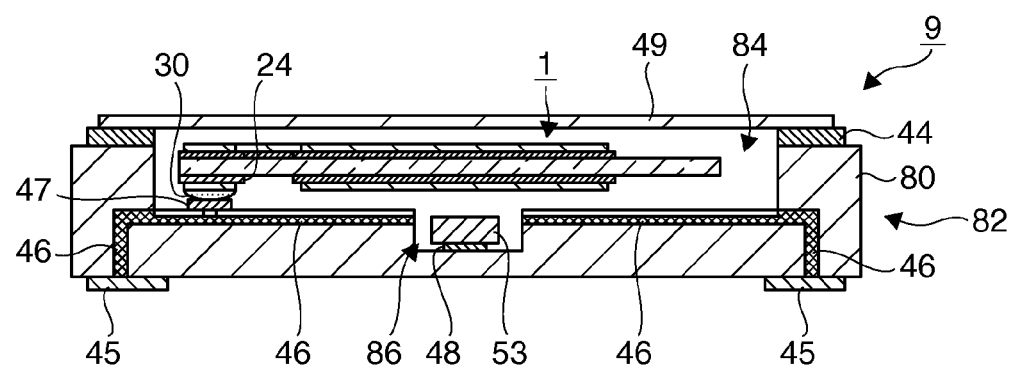

FIG. 12B is a diagram illustrating an electronic device 9 according to a modification example of FIG. 12A. This electronic device is different from the electronic device 8, in that the concave portion 86 is formed at the bottom of the cavity 84 of the package body 80, and that the thermistor 53 is connected to the electronic component mounting pad 48, burned at the bottom of the concave portion 86, through a metal bump or the like. The electronic component mounting pad 48 is electrically conductively connected to the mounting terminal 45. In other words, the resonator element 1 and the thermistor 53 of the thermo-sensitive device are received within the cavity 84, and are hermetically sealed.

As stated above, an example has been described in which the resonator element 1 and the thermistor 53 are received in the package 82, but as electronic parts received in the package 82, it is preferable to form the electronic device 9 that receives at least one of a thermistor, a capacitor, a reactance element, and a semiconductor element.

Since the resonator element can be created as mentioned above, it is possible to considerably shorten the delivery time of the electronic device. In addition, there is an effect capable of quickly coping with a request for various specifications by combining the above-mentioned resonator element with a thermistor, a capacitor, a reactance element, a semiconductor element, and the like.

Next, an electronic apparatus (electronic apparatus according to the invention) to which the resonator element according to the embodiment of the invention is applied will be described in detail with reference to FIGS. 13 to 15.

Figure 13:
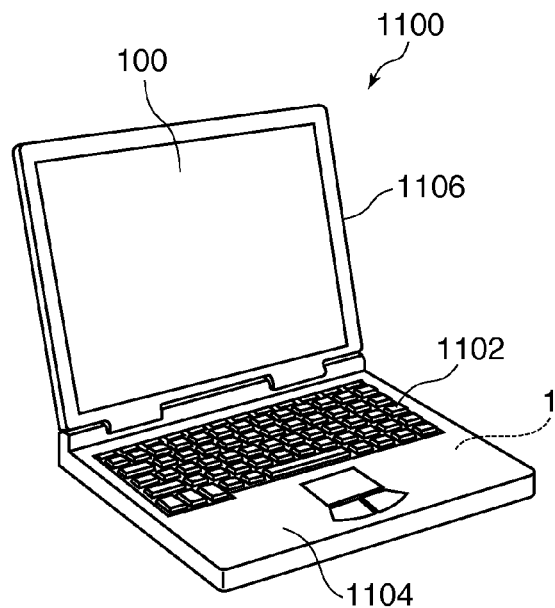
FIG. 13 is a perspective view illustrating a configuration of a mobile type (or note type) personal computer as an electronic apparatus including the resonator element according to an embodiment of the invention.

FIG. 13 is a perspective view illustrating a configuration of a mobile type (or note type) personal computer as an electronic apparatus including the resonator element according to the embodiment of the invention. In this drawing, a personal computer 1100 is constituted by a main body 1104 including a keyboard 1102 and a display unit 1106 including a display portion 100, and a display unit 1106 is rotatably supported to the main body 1104 through a hinge structure. The resonator element 1 functioning as at least one of a filter, a resonator, a reference clock and the like is built in such a personal computer 1100.

Figure 14:
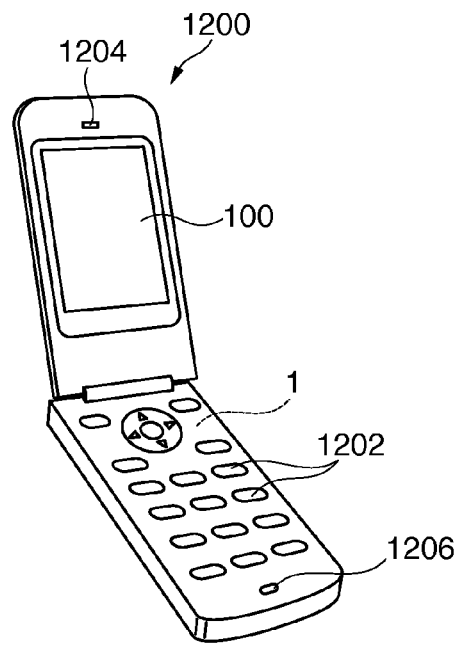
FIG. 14 is a perspective view illustrating a configuration of a cellular phone (also including PHS) as an electronic apparatus including the resonator element according to an embodiment of the invention.

FIG. 14 is a perspective view illustrating a configuration of a cellular phone (also including PHS) as an electronic apparatus including the resonator element according to the embodiment of the invention. In this drawing, a cellular phone 1200 includes a plurality of operation buttons 1202, an ear piece 1204 and a mouth piece 1206, and a display portion 100 is disposed between the operation buttons 1202 and the ear piece 1204. The resonator element 1 functioning as a filter, a resonator and the like is built in such a cellular phone 1200.

Figure 15:
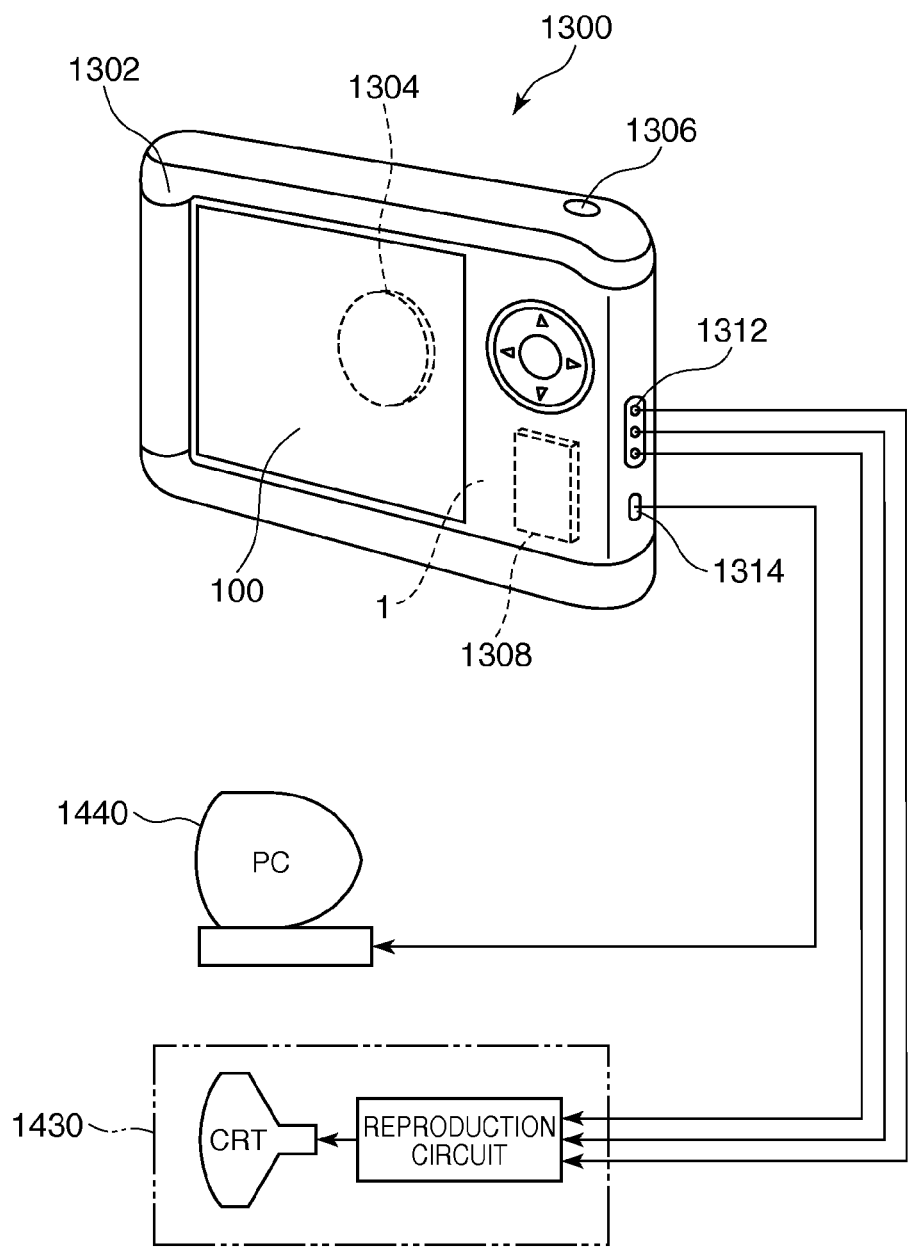
FIG. 15 is a perspective view illustrating a configuration of a digital camera as an electronic apparatus including the resonator element according to an embodiment of the invention.

FIG. 15 is a perspective view illustrating a configuration of a digital camera as an electronic apparatus including the resonator element according to the embodiment of the invention. Meanwhile, connection to an external apparatus is also simply shown in this drawing. Here, a normal camera exposes a silver halide photographic film using light image of a subject, whereas a digital camera 1300 generates an imaging signal (image signal) by photoelectrically converting light image of a subject using an imaging device such as a CCD (Charge Coupled Device).

A display portion 100 is provided on the rear surface of a case (body) 1302 of the digital camera 1300 and displays an image on the basis of a CCD imaging signal, and the display portion 100 functions as a viewfinder that displays a subject as an electronic image. In addition, a light-receiving unit 1304 including an optical lens (imaging optical system), a CCD or the like is provided at the front side (rear side in the drawing) of the case 1302.

When a photographer confirms a subject image displayed on the display portion 100 and holds down a shutter button 1306, a CCD imaging signal at that point in time is transmitted to and stored in a memory 1308. In addition, in the digital camera 1300, a video signal output terminal 1312 and an input and output terminal 1314 for data communication are provided at the lateral side of the case 1302. As shown in the drawing, a TV monitor 1430 is connected to the video signal output terminal 1312, and a personal computer 1440 is connected to the input and output terminal 1314 for data communication, respectively, as necessary. Further, an imaging signal stored in the memory 1308 is output to the TV monitor 1430 or the personal computer 1440, through a predetermined operation. The resonator element 1 functioning as a filter, a resonator or the like is built in such a digital camera 1300.

Meanwhile, in addition to the personal computer (mobile type personal computer) of FIG. 13, the cellular phone of FIG. 14 and the digital camera of FIG. 15, the electronic apparatus including the resonator element according to the embodiment of the invention can be applied to, for example, an ink jet ejecting apparatus (for example, ink jet printer), a laptop personal computer, a TV set, an audio and video camera, a video tape recorder, a car navigation device, a pager, an electronic notebook (also including a communication function), an electronic dictionary, an electronic calculator, an electronic game console, a word processor, a workstation, a TV phone, a security TV monitor, electronic binoculars, a POS terminal, medical instrument (for example, electronic thermometer, sphygmomanometer, blood glucose monitoring system, electrocardiogram measurement device, ultrasound diagnostic device, and electronic endoscope), a fish finder, various types of measuring apparatus, meters and gauges (for example, meters and gauges of a vehicle, an aircraft, and a vessel), a flight simulator, and the like.

Figure 16:
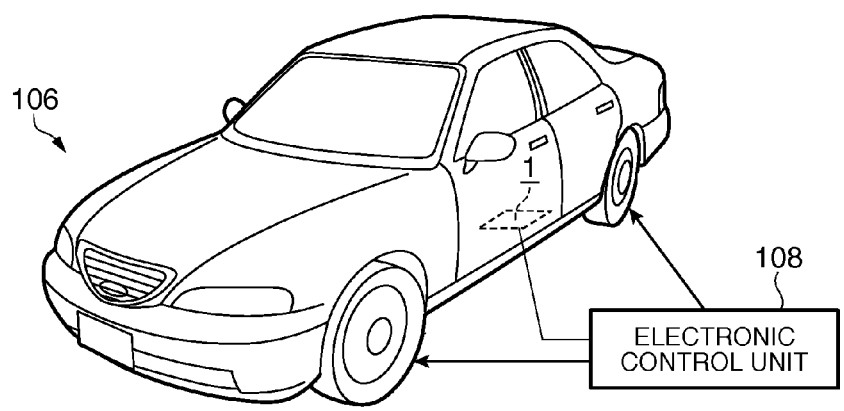
FIG. 16 is a perspective view illustrating a configuration of an automobile as a mobile body to which the resonator or the electronic device including the resonator element according to an embodiment of the invention is applied.

FIG. 16 is a diagram schematically illustrating an automobile 106 as a specific example of a mobile body. A resonator or an electronic device having the resonator element according to the embodiment of the invention is mounted to the automobile 106.

For example, the resonator element can be applied widely to an electronic control unit (ECU) 108 such as keyless entry, an immobilizer, a car navigation system, a car air-conditioner, an antilock brake system (ABS), an air bag, a tire pressure monitoring system (TPMS), engine control, a battery monitor of a hybrid automobile or an electric automobile, and a car-body posture control system.

The entire disclosure of Japanese Patent Application No. 2012-128662, filed Jun. 6, 2012 is expressly incorporated by reference herein.

What is claimed is:

1. A resonator element comprising:
a substrate; and
an electrode that includes:
   a first conductive layer on a surface of the substrate; and
   a second conductive layer on the first conductive layer opposite to the substrate,
   the second conductive layer including an excitation electrode region, a lead electrode region, a pad electrode region, and a connection electrode region,
   an entirety of the excitation electrode region of the second conductive layer being circumferentially recessed relative to an outer peripheral edge of the first conductive layer in a plan view, and
   the first conductive layer being of a first material and the second conductive layer being of a second material different from the first material.

2. The resonator element according to claim 1, wherein a first planar region surrounded by an outer peripheral edge of the excitation electrode region is smaller than a second planar region surrounded by the outer peripheral edge of the first conductive layer.

3. The resonator element according to claim 1, wherein the substrate vibrates through a thickness shear vibration.

4. The resonator element according to claim 1, further comprising:
a vibration portion that vibrates through a thickness shear vibration; and
an outer edge portion formed integrally with an outer edge of the vibration portion, the outer edge portion being thinner than the vibration portion.

5. The resonator element according to claim 1, further comprising:
a vibration portion that vibrates through a thickness shear vibration; and
an outer edge portion formed integrally with an outer edge of the vibration portion, the outer edge portion being thicker than the vibration portion.

6. A resonator comprising:
a resonator element according to claim 1; and
a package in which the resonator element is received.

7. An electronic device comprising:
the resonator element according to claim 1;
an electronic element; and
a container in which the resonator element and the electronic element are mounted.

8. The electronic device according to claim 6, wherein the electronic element is at least one of a thermistor, a capacitor, a reactance element, and a semiconductor element.

9. An electronic apparatus comprising the resonator element according to claim 1.

10. An electronic apparatus comprising the resonator according to claim 6.

11. An electronic apparatus comprising the electronic device according to claim 7.

12. A mobile body comprising the resonator element according to claim 1.

13. The resonator element according to claim 1, wherein
the material of the upper conductive layer is at least one of Au, Ag, and Pt, and
the material of the lower conductive layer is at least one of Cr, Ni, Ti, and a NiCr alloy.

14. A resonator element comprising:
a substrate; and
an electrode on the substrate, the electrode including:
a first conductive layer on a surface of the substrate being of a first material; and
a second conductive layer on a surface of the first conductive layer opposite to the substrate and being of a second material different from the first material, the second conductive layer including an excitation electrode region, a lead electrode region, a pad electrode region, and a connection electrode region,
an outer peripheral edge of the first conductive layer extending beyond an outer peripheral edge of an entirety of the excitation electrode region of the second conductive layer in a plan view.

15. The resonator element according to claim 14, wherein the excitation electrode region is recessed relative to the first conductive layer such that a first planar region surrounded by the outer peripheral edge of the excitation electrode region is smaller than a second planar region surrounded by the outer peripheral edge of the first conductive layer.

* * * * *